(12) United States Patent
Miyagawa et al.

(10) Patent No.: US 8,043,472 B2
(45) Date of Patent: Oct. 25, 2011

(54) SUBSTRATE PROCESSING APPARATUS AND FOCUS RING

(75) Inventors: Masaaki Miyagawa, Nirasaki (JP); Eiichi Nishimura, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 284 days.

(21) Appl. No.: 12/016,607

(22) Filed: Jan. 18, 2008

(65) Prior Publication Data

US 2008/0210379 A1    Sep. 4, 2008

Related U.S. Application Data

(60) Provisional application No. 60/912,930, filed on Apr. 20, 2007.

(30) Foreign Application Priority Data

Jan. 22, 2007 (JP) ................ 2007-011706

(51) Int. Cl.
*C23F 1/00* (2006.01)
*H01L 21/306* (2006.01)
*C23C 16/00* (2006.01)

(52) U.S. Cl. .................. 156/345.51; 118/728

(58) Field of Classification Search ............ 118/728; 156/345.51, 915
See application file for complete search history.

(56) References Cited

U.S. PATENT DOCUMENTS

| | | | |
|---|---|---|---|
| 6,363,882 B1 * | 4/2002 | Hao et al. | 118/723 E |
| 6,514,347 B2 | 2/2003 | Denpoh | |
| 6,723,202 B2 * | 4/2004 | Nagaiwa et al. | 156/345.43 |
| 6,828,243 B2 | 12/2004 | Denpoh | |
| 2003/0215578 A1 * | 11/2003 | Okumura et al. | 427/569 |
| 2005/0061447 A1 * | 3/2005 | Kim et al. | 156/345.51 |

FOREIGN PATENT DOCUMENTS

| | | |
|---|---|---|
| JP | 2001-308079 | 11/2001 |
| JP | 2002-16126 | 1/2002 |

* cited by examiner

*Primary Examiner* — Maureen Gramaglia
(74) *Attorney, Agent, or Firm* — Oblon, Spivak, McClelland, Maier & Neustadt, L.L.P.

(57) ABSTRACT

A substrate processing apparatus that can reliably improve the efficiency of heat transfer between a focus ring and a mounting stage. A housing chamber with the interior thereof evacuated houses a substrate. The substrate is mounted on a mounting stage that is disposed in the housing chamber. An annular focus ring is mounted on the mounting stage such as to surround a peripheral portion of the mounted substrate. A heat transfer film is formed on a surface of the focus ring which contacts the mounting stage by printing processing.

3 Claims, 5 Drawing Sheets

SUBSTRATE PROCESSING APPARATUS AND FOCUS RING

BACKGROUND OF THE INVENTION

1. Field of the Invention

The present invention relates to a substrate processing apparatus and a focus ring, and in particular to a substrate processing apparatus that can improve the efficiency of heat transfer between a mounting stage and a focus ring.

2. Description of the Related Art

In the case of carrying out plasma processing such as etching processing on a wafer as a substrate, the width and depth of trenches formed on a surface of the wafer through etching are affected by the temperature of the wafer, and hence the temperature of the entire surface of the wafer is required to be maintained uniform during the etching processing.

A substrate processing apparatus that subjects a wafer to the etching processing has a chamber that houses the wafer and can be evacuated, and a mounting stage (hereinafter referred to as the "susceptor") on which the wafer is mounted during the etching processing. In the evacuated chamber, plasma is generated, and the wafer is etched by the plasma. The susceptor has a temperature controlling mechanism to control the temperature of the wafer. When the wafer is subjected to the etching processing, the temperature of the wafer rises because it is exposed to heat from the plasma, and thus the temperature controlling mechanism of the susceptor cools the wafer so as to maintain the temperature of the wafer constant.

Moreover, an annular focus ring made of, for example, silicon is mounted on the susceptor such as to surround a peripheral portion of the wafer. The focus ring focuses the plasma in the chamber onto the wafer. The focus ring is also exposed to heat from the plasma during the etching processing, and as a result, the temperature of the focus ring rises to, for example, about 300° C. to 400° C.

During the etching processing, most of the wafer is cooled by the temperature controlling mechanism of the susceptor, but the peripheral portion of the wafer is affected by heat radiated from the focus ring, and it is thus difficult to maintain the temperature of the entire surface of the wafer uniform. Conventionally, because the focus ring is merely mounted on the susceptor, the focus ring and the susceptor do not adhere to each other, and hence the efficiency of heat transfer between the focus ring and the susceptor is low. As a result, heat accumulates in the focus ring, and the temperature of the focus ring cannot be maintained constant, and it is thus difficult to carry out the etching processing uniformly on a plurality of wafers in the same lot.

In view of the foregoing, it is necessary to actively control the temperature of the focus ring. Accordingly, a method of improving the efficiency of heat transfer between the focus ring and the susceptor and actively controlling the temperature of the focus ring using the temperature controlling mechanism of the susceptor has been developed (see, for example, Japanese Laid-Open Patent Publication (Kokai) No. 2002-16126). In this method, a heat transfer sheet is provided between the focus ring and the susceptor so as to improve the efficiency of heat transfer between the focus ring and the susceptor.

However, if the heat transfer sheet is provided between the focus ring and the susceptor, an interface arises between the focus ring and the heat transfer sheet, and also, an interface arises between the heat transfer sheet and the susceptor. The degree of adhesion at each interface is improved as compared with the case where the focus ring and the susceptor are in direct contact with each other, but some minute gaps still remain at each interface. Because the focus ring, heat transfer sheet, and susceptor are placed in an evacuated environment, the minute gaps form a vacuum insulation layer, and each interface obstructs heat transfer. Thus, there is a problem that the efficiency of heat transfer between the focus ring and the susceptor has not been satisfactorily improved.

SUMMARY OF THE INVENTION

The present invention provides a substrate processing apparatus and a focus ring that can reliably improve the efficiency of heat transfer between the focus ring and a mounting stage.

Accordingly, in a first aspect of the present invention, there is provided a substrate processing apparatus comprising a housing chamber that houses a substrate, an interior of the housing chamber being evacuated, a mounting stage that is disposed in the housing chamber and has the substrate mounted thereon, an annular focus ring mounted on the mounting stage such as to surround a peripheral portion of the mounted substrate, and a heat transfer film that is formed on a surface of the focus ring by printing processing, the surface being in contact with the mounting stage.

According to the first aspect of the present invention, because the heat transfer film is formed on the surface of the focus ring which contacts the mounting stage by the printing processing, the focus ring and the heat transfer film satisfactorily adhere to each other, thus preventing an interface from arising between the focus ring and the heat transfer film. As a result, when the focus ring is mounted on the mounting stage, an interface arises only between the heat transfer film and the mounting stage, and hence the efficiency of heat transfer between the focus ring and the mounting stage can be satisfactorily improved.

The present invention can provide a substrate processing apparatus, wherein the printing processing is one selected from the following screen printing processing, coating processing, and spraying processing.

According to the first aspect of the present invention, because the heat transfer film is formed by one of screen printing processing, coating processing, and spraying processing, minute gaps can be reliably prevented from being formed between the focus ring and the heat transfer film, and the heat transfer film can be easily formed.

The present invention can provide a substrate processing apparatus, wherein the heat transfer film comprises an elastic member.

According to the first aspect of the present invention, because the heat transfer film is made of an elastic member, the degree of adherence to the mounting stage is improved, and hence the efficiency of heat transfer between the focus ring and the mounting stage can be further improved.

The present invention can provide a substrate processing apparatus, wherein the elastic member is made of resin.

According to the first aspect of the present invention, because the elastic member is made of resin, it can be easily printed.

The present invention can provide a substrate processing apparatus, wherein the heat transfer film has a thickness of 0.2 mm to 1.0 mm.

According to the first aspect of the present invention, because the heat transfer film has a thickness of 0.2 mm to 1.0 mm, the capacitance of the heat transfer film can be made small, and hence the impedance of the mounting stage as a whole can be prevented from changing due to the formation of the heat transfer film. As a result, the result of substrate processing using plasma can be prevented from being affected by the formation of the heat transfer film.

The present invention can provide a substrate processing apparatus, wherein the mounting stage has, in a portion thereof contacting the heat transfer film, a trench that houses the heat transfer film.

According to the first aspect of the present invention, because the mounting stage has, in a portion thereof contacting the heat transfer film, the trench that houses the heat transfer film, the exposed area of the heat transfer film can be reduced, so that plasma can be prevented from contacting the heat transfer film during substrate processing using the plasma. As a result, the heat transfer film can be prevented from wearing out.

Accordingly, in a second aspect of the present invention, there is provided an annular focus ring in a substrate processing apparatus that comprises a housing chamber that houses a substrate, and a mounting stage that is disposed in the housing chamber and has the substrate mounted thereon, an interior of the housing chamber being evacuated, the focus ring being mounted on the mounting stage such as to surround a peripheral portion of the mounted substrate and comprising a heat transfer film that is formed on a surface that contacts the mounting stage by printing processing.

The features and advantages of the invention will become more apparent from the following detailed description taken in conjunction with the accompanying drawings.

BRIEF DESCRIPTION OF THE DRAWINGS

FIGS. 5A and 5B are graphs showing the distribution of etch rate along the diameter of a wafer in the case where the heat transfer sheet was provided between the focus ring and an electrostatic chuck, and in the case where the heat transfer sheet was not provided between the focus ring and the electrostatic chuck, in which FIG. 5A shows the case where the heat transfer sheet was provided between the focus ring and the electrostatic chuck, and FIG. 5B shows the case where the heat transfer sheet was not provided between the focus ring and the electrostatic chuck.

DETAILED DESCRIPTION OF THE PREFERRED EMBODIMENTS

The present invention will now be described in detail below with reference to the drawings showing a preferred embodiment thereof.

First, a description will be given of a substrate processing apparatus according to an embodiment of the present invention.

Figure 1:
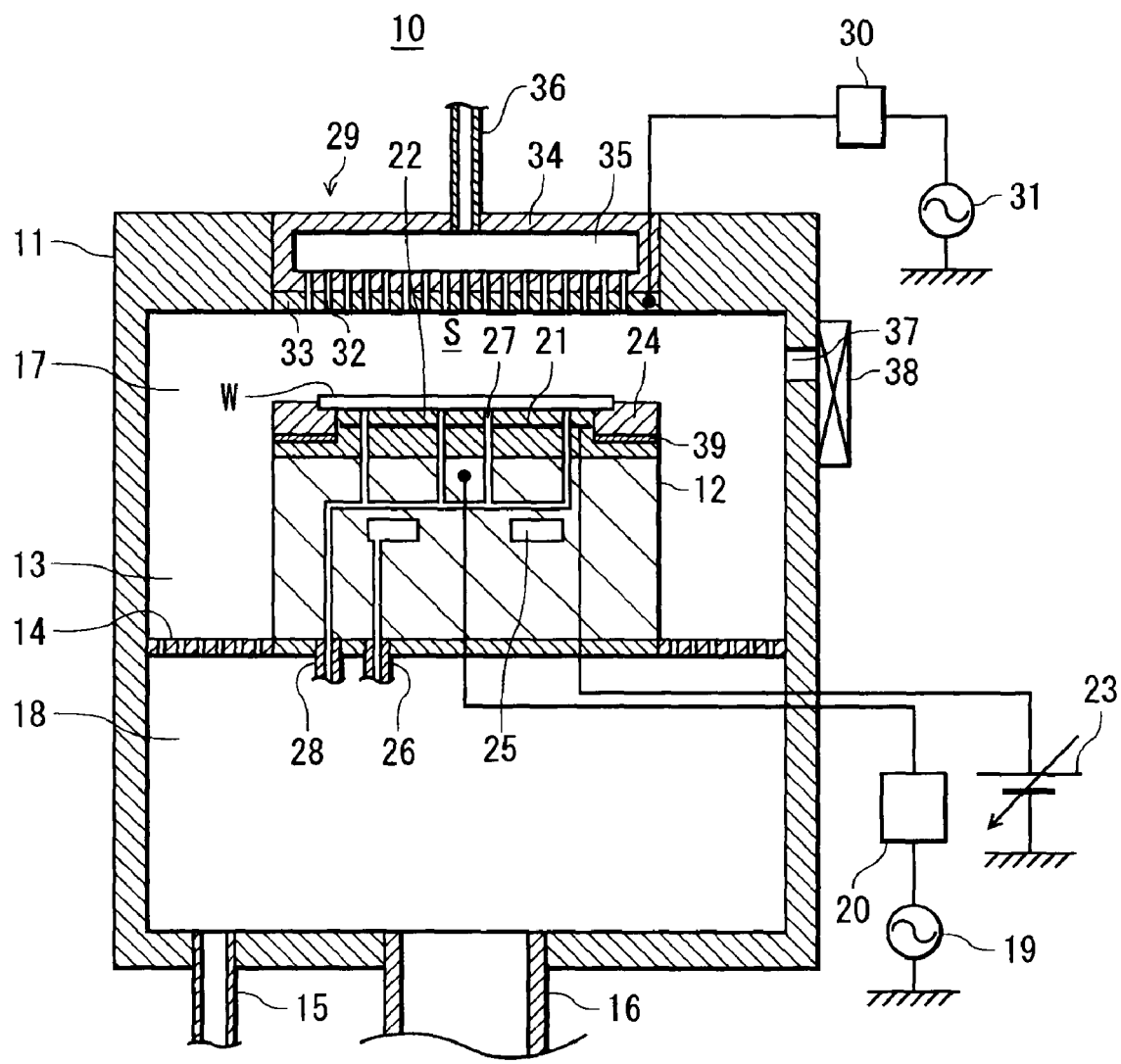
FIG. 1 is a sectional view schematically showing the construction of a substrate processing apparatus according to an embodiment of the present invention.

FIG. 1 is a sectional view schematically showing the construction of a substrate processing apparatus according to the present embodiment. The substrate processing apparatus is constructed such as to carry out etching processing on a semiconductor wafer as a substrate.

As shown in FIG. 1, the substrate processing apparatus 10 has a chamber 11 (housing chamber) in which a semiconductor wafer (hereinafter merely referred to as a "wafer") W having a diameter of, for example, 300 mm is housed. A cylindrical susceptor 12 (mounting stage) is disposed in the chamber 11 as a stage on which the wafer W is mounted. In the substrate processing apparatus 10, a side exhaust path 13 that acts as a flow path through which gas above the susceptor 12 is exhausted out of the chamber 11 is formed between an inner side wall of the chamber 11 and the side face of the susceptor 12. An exhaust plate 14 is disposed part way along the side exhaust path 13. An inner wall surface of the chamber 11 is covered with quarts or yttria ($Y_2O_3$).

The exhaust plate 14 is a plate-like member having a number of holes therein and functions as a partition plate which partitions the chamber 11 into an upper portion and a lower portion. In the upper portion (hereinafter referred to as "the reaction chamber") 17 of the chamber 11 partitioned by the exhaust plate 14, plasma is generated as will be described later. In the lower portion (hereinafter referred to as "the exhaust chamber (manifold)") 18 of the chamber 11, a roughing exhaust pipe 15 and a main exhaust pipe 16 which exhaust gas out of the chamber 11 are opened. The roughing exhaust pipe 15 has a DP (dry pump) (not shown) connected thereto, and the main exhaust pipe 16 has a TMP (turbo-molecular pump) (not shown) connected thereto. The exhaust plate 14 captures or reflects ions and radicals produced in a processing space S, described later, of the reaction chamber 17 to prevent the leakage of ions and radicals therefrom into the manifold 18.

The roughing exhaust pipe 15 and the main exhaust pipe 16 exhaust gas in the reaction chamber 17 out of the chamber 11 via the manifold 18. Specifically, the roughing exhaust pipe 15 reduces the pressure in the chamber 11 from atmospheric pressure down to a low vacuum state, and the main exhaust pipe 16 is operated in collaboration with the roughing exhaust pipe 15 to reduce the pressure in the chamber 11 from atmospheric pressure down to a high vacuum state (e.g. a pressure of not more than 133 Pa (1 Torr)), which is at a lower pressure than the low vacuum state.

A lower radio frequency power source 19 is connected to the susceptor 12 via a lower matcher 20. The lower radio frequency power source 19 applies predetermined radio frequency electrical power to the susceptor 12. The susceptor 12 thus acts as a lower electrode. The lower matcher 20 reduces reflection of the radio frequency electrical power from the susceptor 12 so as to maximize the efficiency of the supply of the radio frequency electrical power into the susceptor 12.

An electrostatic chuck 22 having an electrostatic electrode plate 21 therein is provided in upper portion of the susceptor 12. The electrostatic chuck 22 is formed by overlaying an upper disk-shaped member having a given diameter on a lower disk-shaped member having a larger diameter than the diameter of the upper disk-shaped member. The electrostatic chuck 22 is made of aluminum, and for example, ceramic is thermally sprayed on the upper surface of the upper disk-shaped member. When a wafer W is mounted on the susceptor 12, the wafer W is disposed on the upper disk-shaped member of the electrostatic chuck 22.

Moreover, a DC power source 23 is electrically connected to the electrostatic electrode plate 21 of the electrostatic chuck 22. Upon a positive high DC voltage being applied to the electrostatic electrode plate 21, a negative potential is produced on a surface of the wafer W which faces the electrostatic chuck 22 (hereinafter referred to as "the rear surface of the wafer W"). A potential difference thus arises between the electrostatic electrode plate 21 and the rear surface of the wafer W, and hence the wafer W is attracted to and held on the upper disk-shaped member of the electrostatic chuck 22 through a Coulomb force or a Johnsen-Rahbek force due to the potential difference.

An annular focus ring 24 is disposed in a portion 22a (hereinafter referred to as "the focus ring mounting surface") of the upper surface of the lower disk-shaped member of the electrostatic chuck 22 on which the upper disk-shaped member is not overlaid (see FIG. 2). Namely, the electrostatic chuck 22 has the focus ring 24 directly mounted thereon. The electrostatic chuck 22 thus constitutes a part of the mounting stage.

The focus ring 24 made of a conductive material, for example silicon, surrounds the wafer W attracted to and held on the upper disk-shaped member of the electrostatic chuck 22. Moreover, the focus ring 24 focuses plasma in the processing space S toward a front surface of the wafer W, thus improving the efficiency of the etching processing.

An annular coolant chamber 25 that extends, for example, in a circumferential direction of the susceptor 12 is provided inside the susceptor 12. A coolant, for example cooling water or a Galden (registered trademark) fluid, at a low temperature is circulated through the coolant chamber 25 via coolant piping 26 from a chiller unit (not shown). The temperatures of the wafer W and the focus ring 24 are mainly controlled through the temperature and flow rate of the coolant circulated through the coolant chamber 25.

A plurality of heat transfer gas supply holes 27 are opened to a portion of the upper disk-shaped member of the electrostatic chuck 22 on which the wafer W is attracted and held (hereinafter referred to as the "attracting surface"). The heat transfer gas supply holes 27 are connected to a heat transfer gas supply unit (not shown) by a heat transfer gas supply line 28. The heat transfer gas supply unit supplies helium (He) gas as a heat transfer gas via the heat transfer gas supply holes 27 into a gap between the attracting surface and the rear surface of the wafer W. The helium gas supplied into the gap between the attracting surface and the rear surface of the wafer W effectively transfers heat from the wafer W to the electrostatic chuck 22.

A gas introducing shower head 29 is disposed in a ceiling portion of the chamber 11 such as to face the susceptor 12. An upper radio frequency power source 31 is connected to the gas introducing shower head 29 via an upper matcher 30 and applies predetermined radio frequency electrical power to the gas introducing shower head 29. The gas introducing shower head 29 thus acts as an upper electrode. The upper matcher 30 has a similar function the lower matcher 20 described above.

The gas introducing shower head 29 is comprised of a ceiling electrode plate 33 having a number of gas holes 32 therein, and an electrode supporting 34 that detachably supports the ceiling electrode plate 33. A buffer chamber 35 is provided inside the electrode support 34, and a processing gas introducing pipe 36 is connected to the buffer chamber 35. The gas introducing shower head 29 supplies a processing gas supplied into the buffer chamber 35 from the processing gas introducing pipe 36 into the reaction chamber 17 via the gas holes 32.

A transfer port 37 for use in transferring the wafers W into and out from the reaction chamber 17 is provided in a side wall of the chamber 11, and a gate valve 38 for opening and closing the transfer port 37 is provided in the transfer port 37.

In the reaction chamber 17 of the substrate processing apparatus 10, radio frequency electrical power is applied to the susceptor 12 and the gas introducing shower head 29 so that radio frequency electrical power is applied to the processing space S between the susceptor 12 and the gas introducing shower head 29. As a result, in the processing space S, the processing gas supplied from the gas introducing shower head 29 is turned into high-density plasma so that ions and radicals are produced, whereby the wafer W is subjected to the etching processing by the ions and radicals.

Operation of the component elements of the substrate processing apparatus 10 described above is controlled in accordance with a program for the etching processing by a CPU of a control unit (not shown) of the substrate processing apparatus 10.

In the substrate processing apparatus 10 described above, a heat transfer film 39 made of resin as an elastic material is formed on a surface 24a of the focus ring 24 which contacts the electrostatic chuck 22 (hereinafter merely referred to as the "contact surface") (see FIG. 2). Here, because the electrostatic chuck 22 is cooled by the susceptor 12, the electrostatic chuck 22 is maintained at a lower temperature than the temperature of the focus ring 24 during the etching processing. At this time, the heat transfer film 39 transfers heat of the focus ring 24 to the electrostatic chuck 22. Moreover, because the temperature of the focus ring 24 rises to nearly 200° C. even though it is cooled by the electrostatic chuck 22, the resin constituting the heat transfer film 39 has to be heatproof so that it can maintain its form at high temperature. It is thus preferred that any of the following is used as the resin constituting the heat transfer film 39 is: silicon resin, epoxy resin, fluoro-rubber, phenol resin, polyurethane resin, polyimide, olefin resin, styrene resin, polyester resin, and PVC (polyvinyl chloride resin).

The heat transfer film 39 is formed on the contact surface 24a of the focus ring 24 by printing processing. Specifically, the resin constituting the heat transfer film 39 is directly coated on the contact surface 24a using a brush or the like (coating processing), sprayed onto the contact surface 24a by spraying (spraying processing), or coated on the contact surface 24a by screen printing (screen printing processing). At this time, the contact surface 24a of the focus ring 24 and the resin adhere to each other, the focus ring 24 and the heat transfer film 39 satisfactorily adhere to each other. Therefore, no interface arises between the focus ring 24 and the heat transfer film 39. As a result, when the focus ring 24 is mounted on the electrostatic chuck 22, an interface arises only between the heat transfer film 39 and the electrostatic chuck 22.

Figure 2:
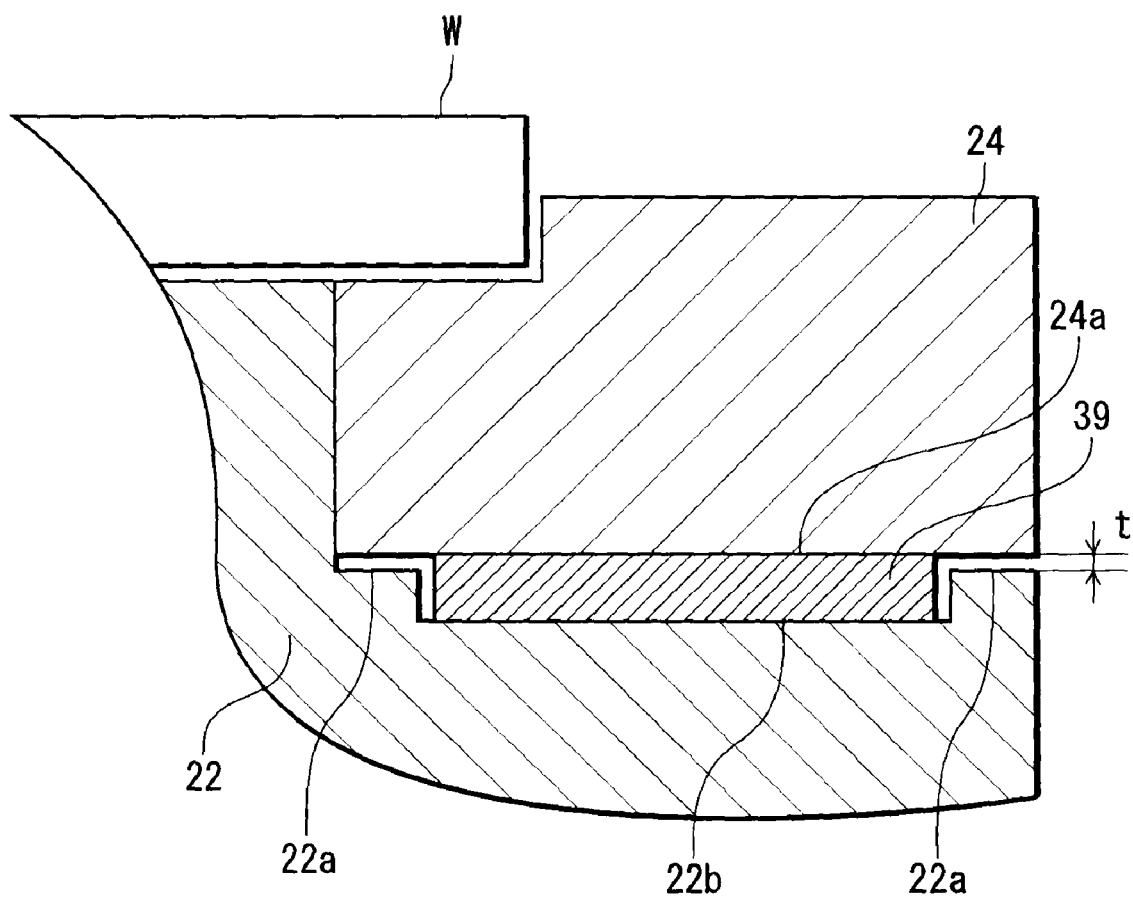
FIG. 2 is an enlarged sectional view showing a focus ring and its vicinity appearing in FIG. 1.

FIG. 2 is an enlarged sectional view showing the focus ring and its vicinity appearing in FIG. 1.

As shown in FIG. 2, a housing trench 22b that houses part of the heat transfer film 39 formed on the contact surface 24a of the focus ring 24 is formed on the focus ring mounting surface 22a. When the focus ring 24 is mounted on the electrostatic chuck 22, and the heat transfer film 39 is partially housed in the housing trench 22b, the gap t between the contact surface 24a of the focus ring 24 and the focus ring mounting surface 22a can be set small. Specifically, in the present embodiment, the gap t is set to about 0.1 mm. Thus, plasma in the reaction chamber 17 can be prevented from entering the housing trench 22b.

Although in the present embodiment, the housing trench 22b for the heat transfer film 39 is formed on the electrostatic chuck 22 side, a housing trench having a similar function may be formed on the contact surface 24a of the focus ring 24, and the heat transfer film 39 may be housed in this housing trench.

In this case as well, the gap t between the contact surface 24a of the focus ring 24 and the focus ring mounting surface 22a can be set small.

The heat transfer film 39 is an insulating member because it is made of resin, and the focus ring 24 and the electrostatic chuck 22 are conductive members, and hence the focus ring 24, heat transfer film 39, and electrostatic chuck 22 constitute a capacitor. As the capacitance of the capacitor increases, the impedance of the susceptor 12 changes. As an example of techniques using this phenomenon, a technique in which an impedance control layer is disposed on a rear surface of a focus ring to actively change the impedance is disclosed in Japanese Unexamined Patent Publication (Kohyo) No. 2003-519907. A change in the impedance of the susceptor 12 affects the distribution of plasma in the processing space S, and also affects the in-plane uniformity of the etching processing on the wafer W. Here, if the heat transfer film 39 is thin, the capacitance of the capacitor described above is small, and it is thus preferred that the thickness of the heat transfer film 39 is small.

Accordingly, to ascertain the effect of the heat transfer film 39 on the impedance of the susceptor 12, the present inventors used a heat transfer sheet 41, which is made of a heat transfer gel having substantially the same relative permittivity as the heat transfer film 39, as a substitute for the heat transfer film 39, and measured the impedance of the susceptor 12 in the case where an insulating member was provided between the focus ring 24 and the electrostatic chuck 22, and in the case where no insulating member was provided between the focus ring 24 and the electrostatic chuck 22.

Figure 3:
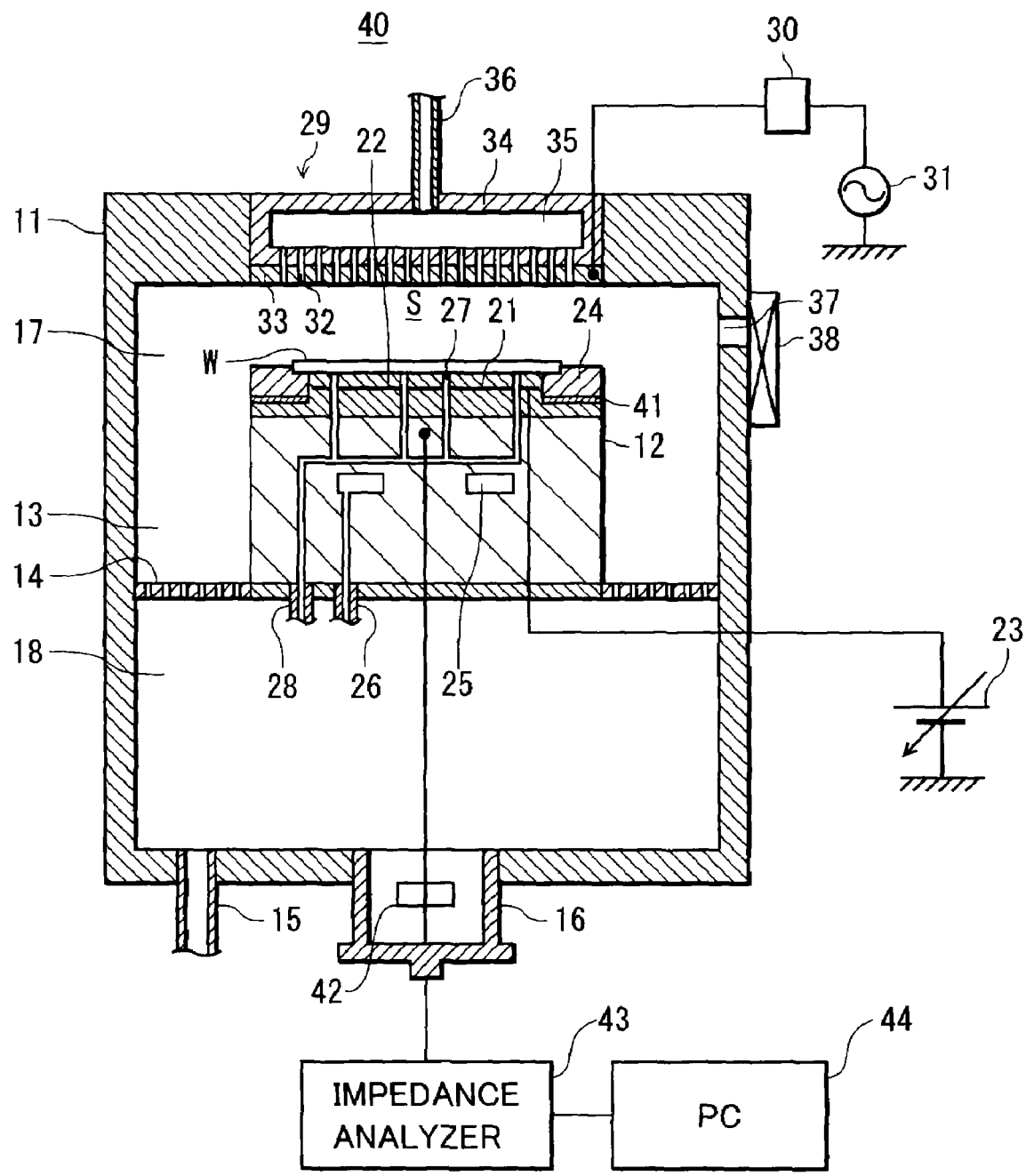
FIG. 3 is a sectional view schematically showing the construction of a device that measures the impedance of a susceptor appearing in FIG. 1.

FIG. 3 is a sectional view schematically showing the construction of a device that measures the impedance of the susceptor appearing in FIG. 1. The construction of an impedance measurement device 40 is basically the same as that of the substrate processing apparatus 10, only differences being described below.

As shown in FIG. 3, the impedance measurement device 40 has an impedance analyzer 43 that is connected to the susceptor 12 via a resistance 42 of 50Ω. The impedance analyzer 43 is connected to a PC (personal computer) 44.

The impedance analyzer 43 emits incident waves of predetermined frequencies, for example 13 MHz and 40 MHz, toward the susceptor 12 and observes reflected waves at the respective frequencies. The PC 44 calculates impedances at the respective frequencies based on the observed reflected waves.

Figure 4:
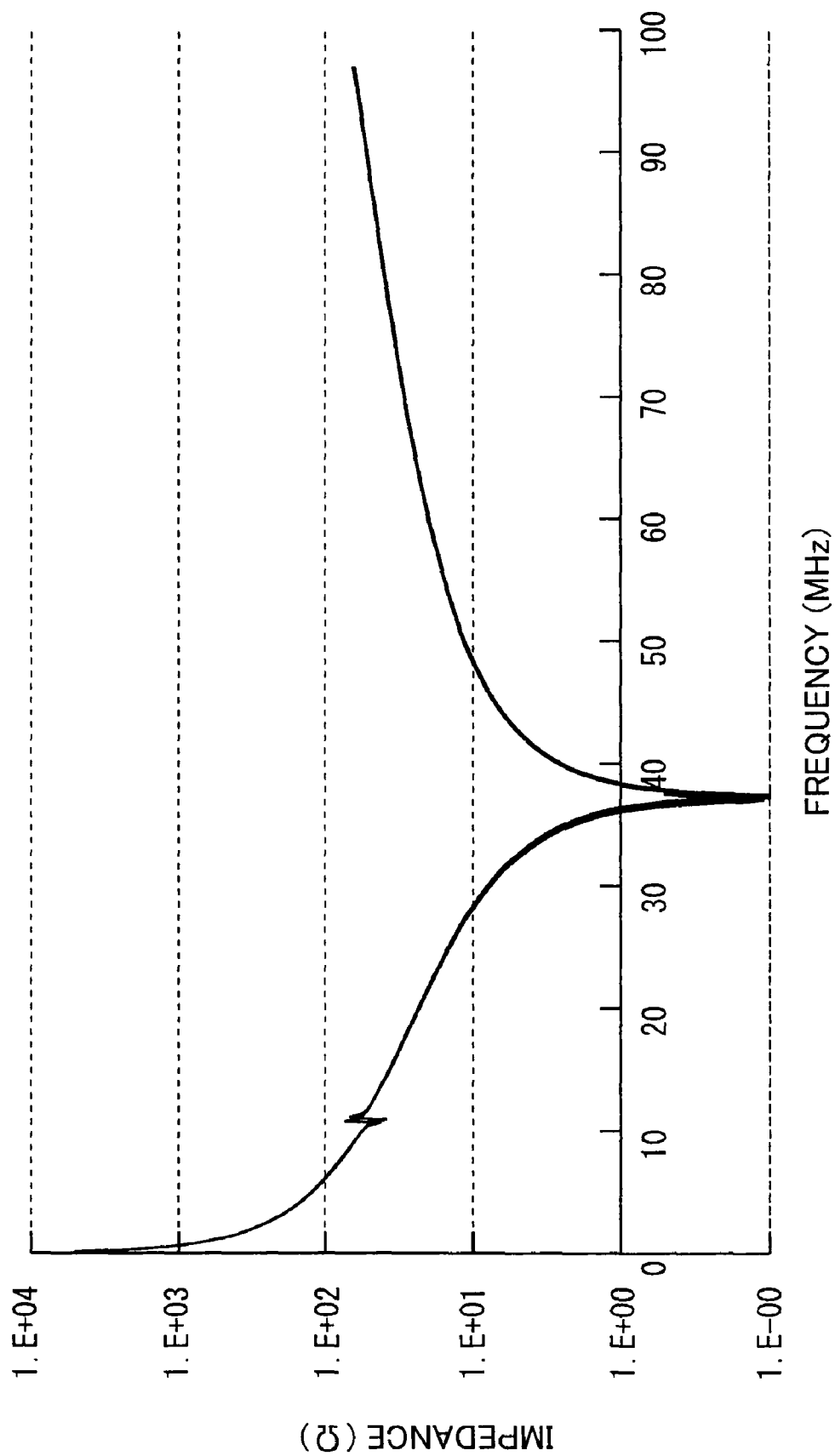
FIG. 4 is a graph showing the impedance of the susceptor at each frequency in the case where a heat transfer sheet as a substitute was provided between the focus ring and an electrostatic chuck, and in the case where the heat transfer sheet was not provided between the focus ring and the electrostatic chuck.

The present inventors measured impedances of the susceptor 12 in the case where the heat transfer sheet 41 having a thickness of 1 mm was provided between the focus ring 24 and the electrostatic chuck 22, and the case where the heat transfer sheet 41 was not provided between the focus ring 24 and the electrostatic chuck 22, and recorded the results in a graph of FIG. 4.

The graph of FIG. 4 shows impedances of the susceptor at respective frequencies in the case where the heat transfer sheet used as a substitute was provided between the focus ring and the electrostatic chuck, and the case where the heat transfer sheet was not provided between the focus ring and the electrostatic chuck.

The graph of FIG. 4 shows impedances of the susceptor 12 in the case where the heat transfer sheet 41 having a thickness of 1 mm was provided between the focus ring 24 and the electrostatic chuck 22, and the case where the heat transfer sheet 41 was not provided between the focus ring 24 and the electrostatic chuck 22, and as shown in the graph of FIG. 4, a difference in impedance between the case where there was provided the heat transfer sheet 41 and the case where there was not provided the heat transfer sheet 41 was not observed. It was thus ascertained that even if the heat transfer sheet 41 having a thickness of 1 mm is provided between the focus ring 24 and the electrostatic chuck 22, this does not affect the impedance of the susceptor 12. Moreover, because the heat transfer sheet 41 has substantially the same relative permittivity as the heat transfer film 39, it was reasoned by analogy that even if the heat transfer film 39 having a thickness of 1 mm is formed on the contact surface 24a of the focus ring 24, this does not affect the impedance of the susceptor 12.

Further, to ascertain the effect of the heat transfer sheet 41 on the etching processing, the prevent inventors carried out the etching processing on a wafer W using the substrate processing apparatus 10 shown in FIG. 1 in the case where the heat transfer sheet 41 having a thickness of 1 mm as a substitute for the heat transfer film 39 was provided between the focus ring 24 and the electrostatic chuck 22, and the case where the heat transfer sheet 41 was not provided between the focus ring 24 and the electrostatic chuck 22. Then, the present inventors calculated the etch rate of the wafer W subjected to the etching processing and recorded in FIG. 5 the distribution of etch rate along the diameter of the wafer W (a direction X that is a given direction, and a direction Y perpendicular to the direction X).

Figure 5A:
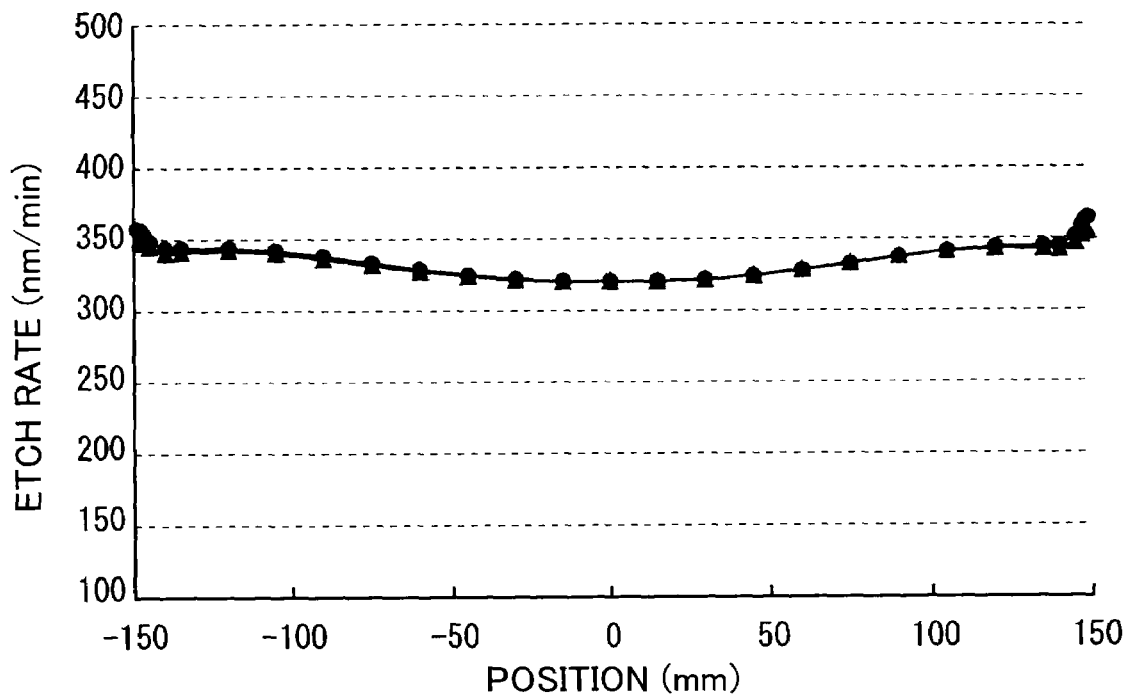
Figure 5B:
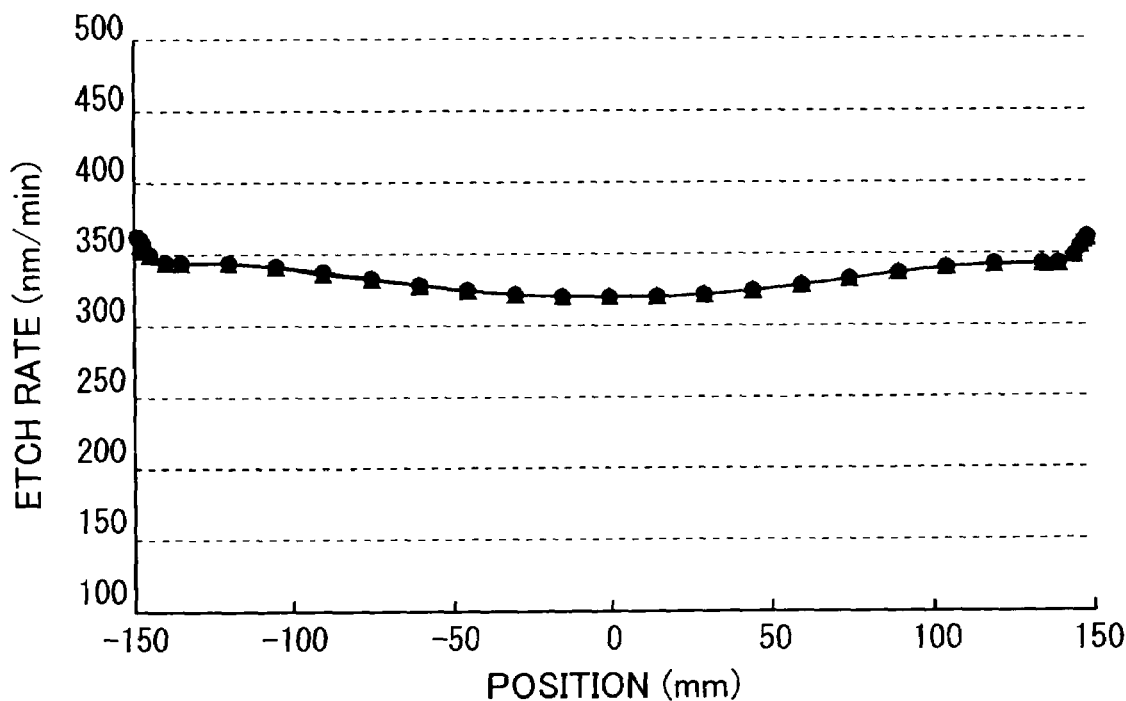

FIGS. 5A and 5B are graphs showing the distribution of etch rate along the diameter of a wafer in the case where the heat transfer sheet was provided between the focus ring and an electrostatic chuck, and in the case where the heat transfer sheet was not provided between the focus ring and the electrostatic chuck, in which FIG. 5A shows the case where the heat transfer sheet was provided between the focus ring and the electrostatic chuck, and FIG. 5B shows the case where the heat transfer sheet was not provided between the focus ring and the electrostatic chuck.

As shown by the graphs of FIGS. 5A and 5B, a difference in the distribution of etch rate between the case where there was provided the heat transfer sheet 41 and the case where there was not provided the heat transfer sheet 41 was not observed. It was thus ascertained that if the heat transfer sheet 41 having a thickness of 1 mm is provided between the focus ring 24 and the electrostatic chuck 22, this does not affect the etching processing.

Based on the above described impedance measurement results, measurement results of distribution of etch rate, and fact that the thickness of the heat transfer film 39 is preferably small, the maximum thickness of the heat transfer film 39 in the present embodiment is set to 1.0 mm.

Moreover, the heat transfer film 39 is sticky, and hence when the focus ring 24 is pulled off from the electrostatic chuck 22 so as to carry out maintenance, the heat transfer film 39 may tear and a part thereof may adhere to and remain on the electrostatic chuck 22. Thus, from the viewpoint of preventing the heat transfer film 39 from tearing, the thickness of the heat transfer film 39 is preferably not less than a certain value, and the minimum thickness of the heat transfer film 39 in the present embodiment is set to 0.2 mm.

According to the substrate processing apparatus of the present embodiment, because the heat transfer film 39 is formed on the contact surface 24a of the focus ring 24 by the printing processing, the focus ring 24 and the heat transfer film 39 satisfactorily adhere to each other, thus preventing an interface from arising between the focus ring 24 and the heat transfer film 39. As a result, when the focus ring 24 is mounted on the electrostatic chuck 22, an interface arises only between the heat transfer film 39 and the electrostatic chuck 22, and hence the efficiency of heat transfer between the focus ring 24 and the electrostatic chuck 22 can be satisfactorily improved.

Moreover, because the efficiency of heat transfer between the focus ring 24 and the electrostatic chuck 22 can be satisfactorily improved, the ranges of hardness and heat transfer rate required for the heat transfer film 39 can be expanded. As a result, the number of types of materials that may be used as the heat transfer film 39 can be increased.

In the substrate processing apparatus 10 described above, because the heat transfer film 39 is formed by directly coating resin on the contact surface 24*a* using a brush or the like, spraying resin onto the contact surface 24*a* by the spraying processing, or coating resin on the contact surface 24*a* by the screen printing processing, minute gaps can be reliably prevented from being formed between the focus ring 24 and the heat transfer film 39, and the heat transfer film 39 can be easily formed. Moreover, because the heat transfer film 39 is made of resin, it can be easily printed.

In the substrate processing apparatus 10 described above, because the heat transfer film 39 is made of resin as an elastic member, the degree of adherence to the bottom of the housing trench 22*b* is improved, and hence the efficiency of heat transfer between the focus ring 24 and the electrostatic chuck 22 can be further improved.

Furthermore, in the substrate processing apparatus 10 described above, because the heat transfer film 39 has a thickness of 0.2 mm to 1.0 mm, the capacitance of the heat transfer film 39 can be made small, and hence the impedance of the electrostatic chuck 22 as a whole can be prevented from changing due to the formation of the heat transfer film 39. As a result, the distribution of etch rate can be prevented from changing, and the etching processing can be prevented from being affected by the formation of the heat transfer film 39.

Moreover, in the substrate processing apparatus 10 described above, because the electrostatic chuck 22 has, on the focus ring mounting surface 22*a* thereof, the housing trench 22*b* that houses part of the heat transfer film 39, the area of the heat transfer film 39 which is exposed to the reaction chamber 17 can be reduced, and the gap t between the contact surface 24*a* and the focus ring mounting surface 22*a* can be set small, so that plasma in the reaction chamber 17 can be prevented from entering the housing trench 22*b*. As a result, plasma can be prevented from contacting the heat transfer film 39 during the etching processing, and the heat transfer film 39 can be prevented from wearing out.

It should be noted in the above described embodiment, the substrates are not limited to being semiconductor wafers W, but rather may instead be glass substrates used in LCDs (Liquid Crystal Displays), FPDs (Flat Panel Displays) or the like.

What is claimed is:

1. A substrate processing apparatus comprising:
   a housing chamber that houses a substrate, an interior of said housing chamber being evacuated, and a plasma being generated in the interior of said housing chamber;
   a mounting stage that is disposed in said housing chamber and has the substrate mounted thereon;
   an annular focus ring mounted on said mounting stage such as to surround a peripheral portion of the mounted substrate; and
   a heat transfer film that is made of resin and formed on a surface of said focus ring by printing processing so as to prevent minute gaps from being formed between said focus ring and said heat transfer film, the surface being in contact with said mounting stage,
   wherein
   said mounting stage has a portion contacting said heat transfer film, a trench is formed in the portion so that the trench houses said heat transfer film having a thickness more than a gap between said focus ring and said mounting stage when said focus ring is mounted on said mounting stage, said housed heat transfer film is exposed to the interior of said housing chamber only via the gap between said focus ring and said mounting stage, and the gap is set to not more than 0.1 mm, and
   wherein the gap between said focus ring and said mounting stage is formed horizontally and said heat transfer film is disposed horizontally.

2. A substrate processing apparatus as claimed in claim 1, wherein the printing processing is one selected from the following: screen printing processing, coating processing, and spraying processing.

3. A substrate processing apparatus as claimed in claim 1, wherein said heat transfer film has a thickness of 0.2 mm to 1.0 mm.

* * * * *